(12) United States Patent
Uzoh et al.

(10) Patent No.: US 11,742,314 B2
(45) Date of Patent: Aug. 29, 2023

(54) RELIABLE HYBRID BONDED APPARATUS

(71) Applicant: ADEIA SEMICONDUCTOR BONDING TECHNOLOGIES INC., San Jose, CA (US)

(72) Inventors: Cyprian Emeka Uzoh, San Jose, CA (US); Pawel Mrozek, San Jose, CA (US)

(73) Assignee: ADEIA SEMICONDUCTOR BONDING TECHNOLOGIES INC., San Jose, CA (US)

( * ) Notice: Subject to any disclaimer, the term of this patent is extended or adjusted under 35 U.S.C. 154(b) by 0 days.

(21) Appl. No.: 17/208,695

(22) Filed: Mar. 22, 2021

(65) Prior Publication Data

US 2021/0305202 A1   Sep. 30, 2021

Related U.S. Application Data

(60) Provisional application No. 63/003,026, filed on Mar. 31, 2020.

(51) Int. Cl.
*H01L 23/48* (2006.01)
*H01L 23/52* (2006.01)
(Continued)

(52) U.S. Cl.
CPC .............. *H01L 24/80* (2013.01); *H01L 24/08* (2013.01); *H01L 2224/08145* (2013.01);
(Continued)

(58) Field of Classification Search
CPC combination set(s) only.
See application file for complete search history.

(56) References Cited

U.S. PATENT DOCUMENTS

| 5,051,802 | A | 9/1991 | Prost et al. |
| 5,753,536 | A | 5/1998 | Sugiyama et al. |

(Continued)

FOREIGN PATENT DOCUMENTS

| CN | 104246971 A | 12/2014 |
| CN | 106409650 A | 2/2017 |

(Continued)

OTHER PUBLICATIONS

Inoue, F. et al., "Influence of composition of SiCN as interfacial layer on plasma activated direct bonding," ECS Journal of Solid State Science and Technology, 2019, vol. 8, No. 6, pp. P346-P350.
(Continued)

*Primary Examiner* — Niki H Nguyen
(74) *Attorney, Agent, or Firm* — Knobbe, Martens, Olson & Bear, LLP

(57) ABSTRACT

Reliable hybrid bonded apparatuses are provided. An example process cleans nanoparticles from at least the smooth oxide top layer of a surface to be hybrid bonded after the surface has already been activated for the hybrid bonding. Conventionally, such an operation is discouraged. However, the example cleaning processes described herein increase the electrical reliability of microelectronic devices. Extraneous metal nanoparticles can enable undesirable current and signal leakage from finely spaced traces, especially at higher voltages with ultra-fine trace pitches. In the example process, the extraneous nanoparticles may be both physically removed and/or dissolved without detriment to the activated bonding surface.

21 Claims, 5 Drawing Sheets

(51) Int. Cl.
    *H01L 29/40*      (2006.01)
    *H01L 23/00*      (2006.01)
(52) U.S. Cl.
    CPC ............... *H01L 2224/80011* (2013.01); *H01L 2224/80013* (2013.01); *H01L 2224/80031* (2013.01); *H01L 2224/80895* (2013.01); *H01L 2224/80896* (2013.01)

(56) References Cited

U.S. PATENT DOCUMENTS

| | | | |
|---|---|---|---|
| 5,771,555 A | 6/1998 | Eda et al. |
| 6,080,640 A | 6/2000 | Gardner et al. |
| 6,423,640 B1 | 7/2002 | Lee et al. |
| 6,465,892 B1 | 10/2002 | Suga |
| 6,887,769 B2 | 5/2005 | Kellar et al. |
| 6,908,027 B2 | 6/2005 | Tolchinsky et al. |
| 7,045,453 B2 | 5/2006 | Canaperi et al. |
| 7,105,980 B2 | 9/2006 | Abbott et al. |
| 7,193,423 B1 | 3/2007 | Dalton et al. |
| 7,550,366 B2 | 6/2009 | Suga et al. |
| 7,582,971 B2 | 9/2009 | Kameyama et al. |
| 7,663,231 B2 | 2/2010 | Chang et al. |
| 7,686,912 B2 | 3/2010 | Suga et al. |
| 7,750,488 B2 | 7/2010 | Patti et al. |
| 7,759,751 B2 | 7/2010 | Ono |
| 7,803,693 B2 | 9/2010 | Trezza |
| 8,168,458 B2 | 5/2012 | Do et al. |
| 8,183,127 B2 | 5/2012 | Patti et al. |
| 8,193,632 B2 | 6/2012 | Chang et al. |
| 8,263,434 B2 | 9/2012 | Pagaila et al. |
| 8,268,699 B2 | 9/2012 | Park et al. |
| 8,318,586 B2 | 11/2012 | Libralesso et al. |
| 8,349,635 B1 | 1/2013 | Gan et al. |
| 8,377,798 B2 | 2/2013 | Peng et al. |
| 8,441,131 B2 | 5/2013 | Ryan |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,524,533 B2 | 9/2013 | Tong et al. |
| 8,618,659 B2 | 12/2013 | Sato et al. |
| 8,620,164 B2 | 12/2013 | Heck et al. |
| 8,647,987 B2 | 2/2014 | Yang et al. |
| 8,697,493 B2 | 4/2014 | Sadaka |
| 8,716,105 B2 | 5/2014 | Sadaka et al. |
| 8,791,575 B2 | 7/2014 | Oganesian et al. |
| 8,802,538 B1 | 8/2014 | Liu |
| 8,809,123 B2 | 8/2014 | Liu et al. |
| 8,841,002 B2 | 9/2014 | Tong |
| 8,866,305 B2 | 10/2014 | Sadaka et al. |
| 8,878,353 B2 | 11/2014 | Haba et al. |
| 9,093,350 B2 | 7/2015 | Endo et al. |
| 9,136,293 B2 | 9/2015 | Yee et al. |
| 9,142,459 B1 | 9/2015 | Kumar et al. |
| 9,142,517 B2 | 9/2015 | Liu |
| 9,171,756 B2 | 10/2015 | Enquist et al. |
| 9,184,125 B2 | 11/2015 | Enquist et al. |
| 9,224,704 B2 | 12/2015 | Landru |
| 9,230,941 B2 | 1/2016 | Chen et al. |
| 9,252,172 B2 | 2/2016 | Chow et al. |
| 9,257,399 B2 | 2/2016 | Kuang et al. |
| 9,299,736 B2 | 3/2016 | Chen et al. |
| 9,312,229 B2 | 4/2016 | Chen et al. |
| 9,331,149 B2 | 5/2016 | Tong et al. |
| 9,337,235 B2 | 5/2016 | Chen et al. |
| 9,385,024 B2 | 7/2016 | Tong et al. |
| 9,394,161 B2 | 7/2016 | Cheng et al. |
| 9,431,368 B2 | 8/2016 | Enquist et al. |
| 9,437,572 B2 | 9/2016 | Chen et al. |
| 9,443,796 B2 | 9/2016 | Chou et al. |
| 9,461,007 B2 | 10/2016 | Chun et al. |
| 9,476,898 B2 | 10/2016 | Takano |
| 9,496,239 B1 | 11/2016 | Edelstein et al. |
| 9,536,848 B2 | 1/2017 | England et al. |
| 9,559,081 B1 | 1/2017 | Lai et al. |
| 9,620,481 B2 | 4/2017 | Edelstein et al. |
| 9,656,852 B2 | 5/2017 | Cheng et al. |
| 9,723,716 B2 | 8/2017 | Weinhold |
| 9,728,521 B2 | 8/2017 | Tsai et al. |
| 9,741,620 B2 | 8/2017 | Uzoh et al. |
| 9,799,587 B2 | 10/2017 | Fujii et al. |
| 9,852,988 B2 | 12/2017 | Enquist et al. |
| 9,893,004 B2 | 2/2018 | Yazdani |
| 9,929,050 B2 | 3/2018 | Lin |
| 9,941,241 B2 | 4/2018 | Edelstein et al. |
| 9,941,243 B2 | 4/2018 | Kim et al. |
| 9,953,941 B2 | 4/2018 | Enquist |
| 9,960,142 B2 | 5/2018 | Chen et al. |
| 9,971,777 B2 | 5/2018 | Bertin et al. |
| 10,002,844 B1 | 6/2018 | Wang et al. |
| 10,026,605 B2 | 7/2018 | Doub et al. |
| 10,075,657 B2 | 9/2018 | Fahim et al. |
| 10,204,893 B2 | 2/2019 | Uzoh et al. |
| 10,269,756 B2 | 4/2019 | Uzoh |
| 10,269,853 B2 | 4/2019 | Katkar et al. |
| 10,276,619 B2 | 4/2019 | Kao et al. |
| 10,276,909 B2 | 4/2019 | Huang et al. |
| 10,418,277 B2 | 9/2019 | Cheng et al. |
| 10,446,456 B2 | 10/2019 | Shen et al. |
| 10,446,487 B2 | 10/2019 | Huang et al. |
| 10,446,532 B2 | 10/2019 | Uzoh et al. |
| 10,508,030 B2 | 12/2019 | Katkar et al. |
| 10,515,925 B2 | 12/2019 | Uzoh |
| 10,522,499 B2 | 12/2019 | Enquist et al. |
| 10,566,219 B2 | 2/2020 | Kurita et al. |
| 10,707,087 B2 | 7/2020 | Uzoh et al. |
| 10,714,449 B2 | 7/2020 | Uzoh |
| 10,727,219 B2 | 7/2020 | Uzoh et al. |
| 10,784,191 B2 | 9/2020 | Huang et al. |
| 10,790,262 B2 | 9/2020 | Uzoh et al. |
| 10,840,135 B2 | 11/2020 | Uzoh |
| 10,840,205 B2 | 11/2020 | Fountain, Jr. et al. |
| 10,854,578 B2 | 12/2020 | Morein |
| 10,879,212 B2 | 12/2020 | Uzoh et al. |
| 10,886,177 B2 | 1/2021 | DeLaCruz et al. |
| 10,892,246 B2 | 1/2021 | Uzoh |
| 10,923,408 B2 | 2/2021 | Huang et al. |
| 10,923,413 B2 | 2/2021 | DeLaCruz |
| 10,937,755 B2 | 3/2021 | Shah et al. |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,004,757 B2 | 5/2021 | Katkar et al. |
| 11,011,494 B2 | 5/2021 | Gao et al. |
| 11,011,503 B2 | 5/2021 | Wang et al. |
| 11,031,285 B2 | 6/2021 | Katkar et al. |
| 11,037,919 B2 | 6/2021 | Uzoh et al. |
| 11,056,348 B2 | 7/2021 | Theil |
| 11,069,734 B2 | 7/2021 | Katkar |
| 11,088,099 B2 | 8/2021 | Katkar et al. |
| 11,127,738 B2 | 9/2021 | DeLaCruz et al. |
| 11,158,606 B2 | 10/2021 | Gao et al. |
| 11,171,117 B2 | 11/2021 | Gao et al. |
| 11,176,450 B2 | 11/2021 | Teig et al. |
| 11,256,004 B2 | 2/2022 | Haba et al. |
| 11,264,357 B1 | 3/2022 | DeLaCruz et al. |
| 11,276,676 B2 | 3/2022 | Enquist et al. |
| 11,329,034 B2 | 5/2022 | Tao et al. |
| 11,348,898 B2 | 5/2022 | DeLaCruz et al. |
| 11,355,443 B2 | 6/2022 | Huang et al. |
| 2002/0003307 A1 | 1/2002 | Suga |
| 2002/0048906 A1 | 4/2002 | Sakai et al. |
| 2002/0053730 A1 | 5/2002 | Mashino |
| 2004/0084414 A1 | 5/2004 | Sakai et al. |
| 2004/0235266 A1 | 11/2004 | Tong |
| 2005/0009246 A1 | 1/2005 | Enquist et al. |
| 2005/0031795 A1 | 2/2005 | Chaudhury et al. |
| 2006/0057945 A1 | 3/2006 | Hsu et al. |
| 2006/0087042 A1 | 4/2006 | Kameyama et al. |
| 2007/0075417 A1 | 4/2007 | Hwang et al. |
| 2007/0111386 A1 | 5/2007 | Kim et al. |
| 2008/0308928 A1 | 12/2008 | Chang |

(56) References Cited

U.S. PATENT DOCUMENTS

| | | |
|---|---|---|
| 2009/0227089 A1 | 9/2009 | Plaut et al. |
| 2009/0298264 A1 | 12/2009 | Arai et al. |
| 2010/0167534 A1 | 7/2010 | Iwata |
| 2011/0175243 A1 | 7/2011 | Jo et al. |
| 2012/0187516 A1 | 7/2012 | Sato |
| 2012/0194719 A1 | 8/2012 | Churchwell et al. |
| 2013/0026643 A1 | 1/2013 | England et al. |
| 2013/0252399 A1 | 9/2013 | Leduc et al. |
| 2013/0270328 A1* | 10/2013 | Di Cioccio ......... H01L 21/2007 228/205 |
| 2014/0001949 A1 | 1/2014 | Kimura et al. |
| 2014/0011324 A1 | 1/2014 | Liu et al. |
| 2014/0175655 A1 | 6/2014 | Chen et al. |
| 2014/0312511 A1 | 10/2014 | Nakamura et al. |
| 2014/0314370 A1 | 10/2014 | Hatori et al. |
| 2015/0064498 A1 | 3/2015 | Tong |
| 2015/0118825 A1 | 4/2015 | Ishizuka |
| 2015/0255349 A1 | 9/2015 | Holden et al. |
| 2015/0314385 A1 | 11/2015 | Abe et al. |
| 2016/0126218 A1 | 5/2016 | Kurita |
| 2016/0343682 A1 | 11/2016 | Kawasaki |
| 2018/0005977 A1 | 1/2018 | Lin et al. |
| 2018/0012787 A1 | 1/2018 | Oka et al. |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0219038 A1 | 8/2018 | Gambino et al. |
| 2018/0308819 A1 | 10/2018 | Uzoh |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2019/0096741 A1 | 3/2019 | Uzoh et al. |
| 2019/0115277 A1 | 4/2019 | Yu et al. |
| 2019/0131277 A1 | 5/2019 | Yang et al. |
| 2019/0157333 A1* | 5/2019 | Tsai ......... H01L 21/78 |
| 2019/0198409 A1 | 6/2019 | Katkar et al. |
| 2019/0199058 A1 | 6/2019 | Pierer et al. |
| 2019/0252364 A1 | 8/2019 | Uzoh et al. |
| 2019/0265411 A1 | 8/2019 | Huang et al. |
| 2019/0326252 A1 | 10/2019 | Mandalapu et al. |
| 2019/0333550 A1 | 10/2019 | Fisch |
| 2019/0348336 A1 | 11/2019 | Katkar et al. |
| 2019/0358955 A1 | 11/2019 | Giusti et al. |
| 2019/0371761 A1 | 12/2019 | Uzoh et al. |
| 2019/0385935 A1 | 12/2019 | Gao et al. |
| 2019/0385966 A1 | 12/2019 | Gao et al. |
| 2020/0013637 A1 | 1/2020 | Haba |
| 2020/0013754 A1 | 1/2020 | Gao et al. |
| 2020/0013765 A1 | 1/2020 | Fountain, Jr. et al. |
| 2020/0035641 A1 | 1/2020 | Fountain, Jr. et al. |
| 2020/0075520 A1 | 3/2020 | Gao et al. |
| 2020/0075534 A1 | 3/2020 | Gao et al. |
| 2020/0075553 A1 | 3/2020 | DeLaCruz et al. |
| 2020/0118973 A1 | 4/2020 | Wang et al. |
| 2020/0126906 A1 | 4/2020 | Uzoh et al. |
| 2020/0194396 A1 | 6/2020 | Uzoh |
| 2020/0227367 A1 | 7/2020 | Haba et al. |
| 2020/0243380 A1 | 7/2020 | Uzoh et al. |
| 2020/0279821 A1 | 9/2020 | Haba et al. |
| 2020/0294908 A1 | 9/2020 | Haba et al. |
| 2020/0299127 A1 | 9/2020 | Brioschi et al. |
| 2020/0321307 A1 | 10/2020 | Uzoh |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0365575 A1 | 11/2020 | Uzoh et al. |
| 2020/0371154 A1 | 11/2020 | DeLaCruz et al. |
| 2020/0395321 A1 | 12/2020 | Katkar et al. |
| 2020/0411483 A1 | 12/2020 | Uzoh et al. |
| 2021/0098412 A1 | 4/2021 | Haba et al. |
| 2021/0118864 A1 | 4/2021 | DeLaCruz et al. |
| 2021/0143125 A1 | 5/2021 | DeLaCruz et al. |
| 2021/0181510 A1 | 6/2021 | Katkar et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0242152 A1 | 8/2021 | Fountain, Jr. et al. |
| 2021/0296282 A1 | 9/2021 | Gao et al. |
| 2021/0366820 A1 | 11/2021 | Uzoh |
| 2021/0375850 A1 | 12/2021 | Uzoh et al. |
| 2021/0407941 A1 | 12/2021 | Haba |
| 2022/0077063 A1 | 3/2022 | Haba |
| 2022/0077087 A1 | 3/2022 | Haba |
| 2022/0139867 A1 | 5/2022 | Uzoh |
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |

FOREIGN PATENT DOCUMENTS

| | | |
|---|---|---|
| CN | 107331759 A | 11/2017 |
| EP | 1011133 A1 | 6/2000 |
| JP | 2002-353416 A | 12/2002 |
| JP | 2008-130603 A | 6/2008 |
| JP | 2008-244080 A | 10/2008 |
| JP | 2009-514185 A | 4/2009 |
| JP | 2011-104633 A | 6/2011 |
| JP | 2013-33786 A | 2/2013 |
| JP | 2015-517217 A | 6/2015 |
| JP | 2016-072316 A | 5/2016 |
| JP | 2018-160519 A | 10/2018 |
| TW | 201401573 A | 1/2014 |
| TW | 201423873 A | 6/2014 |
| TW | 201612965 A | 4/2016 |
| WO | WO 00/59006 A1 | 10/2000 |
| WO | 2005-043584 A2 | 5/2005 |
| WO | WO 2007/021639 A2 | 2/2007 |
| WO | WO 2008/112101 A2 | 9/2008 |
| WO | WO 2009/158378 A2 | 12/2009 |
| WO | WO 2012/133760 A1 | 7/2014 |
| WO | WO 2016/003709 A1 | 1/2016 |
| WO | WO 2018/194827 A1 | 10/2018 |

OTHER PUBLICATIONS

International Search Report and Written Opinion for PCT/US2021/024312, dated Jul. 15, 2021, 10 pages.

Ker, Ming-Dou et al., "Fully Process-Compatible Layout Design on Bond Pad to Improve Wire Bond Reliability in CMOS ICs," IEEE Transactions on Components and Packaging Technologies, Jun. 2002, vol. 25, No. 2, pp. 309-316.

Moriceau, H. et al., "Overview of Recent Direct Wafer Bonding Advances and Applications", Advances in Natural Sciences—Nanoscience and Nanotechnology, 2010, 12 pages.

Nakanishi, H. et al., "Studies on SiO2—SiO2 Bonding with Hydrofluoric Acid. Room Temperature and Low Stress Bonding Technique for MEMS," Tech. Research Lab., 200, Elsevier Science S.A., 8 pages.

Oberhammer et al., "Sealing of Adhesive Bonded Devices on Wafer Level," in Sensors and Actuators A, vol. 110, No. 1-3, pp. 407-412, Feb. 29, 2004, see pp. 407-412; and figures 1(a)-1(l), 6 pages.

Plobi et al., "Wafer Direct Bonding: Tailoring Adhesion Between Brittle Materials," Materials Science and Engineering Review Journal, 1999, 88 pages.

Suga et al., "Bump-less Interconnect for Next Generation System Packaging", IEEE, 2001 and ECTC, 2001, 6 pages.

Suga et al., "Feasibility of surface activated bonding for ultra-fine

(56) References Cited

OTHER PUBLICATIONS pitch interconnection—a new concept of bump-less direct bonding for system level packaging", IEEE, 2000, 1 page.

* cited by examiner

RELIABLE HYBRID BONDED APPARATUS

CROSS-REFERENCE TO RELATED APPLICATION

This application claims priority to U.S. Provisional Patent Application No. 62/003,026, filed Mar. 31, 2020, titled "RELIABLE HYBRID BONDED APPARATUS," the entire contents of each of which are hereby incorporated herein by reference.

BACKGROUND

In a direct bonding process between smooth surfaces, very small spurious particles may appear at the bonding interface. These spurious particles are small, and the concentration of the particles is usually not high enough to be detrimental to the direct bond, even if the particles are spaced at 0.05-0.10 microns ($\mu$m) from each other. This is because the spurious particles themselves are so very small. At sizes around 1-10 nanometers (nm), as shown in FIG. 1, for example, the particles 100 merely become trapped in the completed direct bond, and do not significantly affect a vertical direct bond between dielectric surfaces, which are nonmetals (1000 nanometers (nm)=1 micron ($\mu$m)).

But when the direct boding process is hybrid and includes metal-to-metal direct bonding in conjunction with direct bonding of dielectric materials, very small conductive particles in the 1-10 nm size range may be present in great enough quantity to cause leakage or change in bias of conductive features, especially in microelectronic devices with submicron wiring rules or submicron trace pitches. If higher voltage is present, then in unbonded substrates the unwanted particles can also become nucleation sites for electrochemical or non-electrochemical reactions at the bonding interface or near conductive traces, and in some cases can cause slight micro-delamination of direct bonded constituents near conductive features. In the presence of voltage or other energy forces, one of the main negative effects of the spurious particles is that they may cause signal leakage between adjacent conductive features. A nominal 1 $\mu$m or submicron horizontal spacing, for example a 0.05 $\mu$m spacing, between adjacent or vertical conductors at the direct bonding interface might be bridged, or capacitively biased or breached by intervening conductive nanoparticles The extraneous conductive nanoparticles may be present as planarization defects, as the aftermath of a brush scrubbing step of chemical-mechanical polishing (CMP), or from a plasma ashing or activation step. The particles may also be present from a simple surface cleaning operation or from a particle redeposition during a sputtering operation or plasma processing operations. If the surface to be direct bonded is on a die, then the die singulation process also generates particles, contaminants, and edge defects, and so the die preparation process may require more cleaning effort than does wafer-to-wafer bonding prior to subsequent dicing. The die handling steps can also add particle contamination if the process is not well designed and controlled. But the leftover tiniest particles at sizes between 1-10 nm, for example, are generally the aftermath of cleaning and surface polishing and planarization processes or plasma processing among others, not the dicing process, which tends to produces larger substrate and dielectric particles that can be more easily removed.

SUMMARY

Reliable hybrid bonded apparatuses are provided. An example process cleans nanoparticles from at least the smooth dielectric top layer of a surface to be hybrid bonded after the surface has already been activated for the hybrid bonding. Conventionally, after the activation step, the activated surface is cleaned with deionized water (DIW) and cleaning with other chemicals is often discouraged. However, the example cleaning processes described herein increase the electrical reliability of microelectronic devices. Extraneous conductive and non-conductive particles, for example metal nanoparticles, can enable undesirable current and signal leakage between finely spaced conductive features, such as lines or trenches or vias, especially at higher voltages with ultra-fine trace pitches. In some applications, the conductive features are planar conductive layers embedded in a planar dielectric layer (e.g., damascene structures). In other applications, the conductive features of interest may be disposed over a dielectric layer (e.g., redistribution layers (RDLs)). In the apparatuses and techniques described herein, the extraneous nanoparticles may be both physically removed and/or dissolved without detriment to the activated bonding surface, the conductive features, the dielectric layer, or combinations thereof.

This summary is not intended to identify key or essential features of the claimed subject matter, nor is it intended to be used as an aid in limiting the scope of the claimed subject matter.

DETAILED DESCRIPTION

Overview

This disclosure describes reliable hybrid bonded apparatuses. Hybrid bonding is a conventionally reliable technology capable of easily creating 150,000,000 interconnects on a 200 mm wafer with a 99.999% success rate. As the lead spacing and conductive features pitches decrease approaching 1 micron ($\mu$m) and submicron spacing, the presence of very small artifactual metal particles from various cleaning and fabrication operations can come into play to effect electrical performance involving currents and signals of the conductive features or traces, and can seed various local discontinuities. Extraneous metal particles as small as 1-10 nm can register measurable compromises in reliability. Moreover, hybrid bonding technology is considered to be capable of attaining much smaller pads, and finer pitches are under development. As the spacing and conductive features pitches go under 1 $\mu$m, the presence of the extraneous metal nanoparticles becomes proportionately more significant due to their effect on the electrical operation of the microelectronic device. In some applications, the conductive features described herein include planar conductive layer(s) embedded in one or more planar dielectric layer(s) (e.g., damascene structures). In other applications, the conductive features of interest may be disposed over a dielectric layer and vice versa (e.g., redistribution layers (RDLs)).

An example process described herein takes the counterintuitive step of cleaning the smooth oxide surface and its metal recesses after the surface has already been activated for hybrid bonding, generally with plasma or other means of creating free radicals with ion charges at the ultimate surface of the bonding layer. This example process and cleaning procedure goes against conventional wisdom which holds that the ultra-flat, ultra-smooth, and ultra-clean oxide surface about to participate in direct bonding is sacrosanct and not to be further touched or interacted with in any way, prior to imminent direct bonding with another like surface. Conventionally, apart from post surface activation rinsing with deionized water (DIW), the plasma surface activation step is the de facto last step before direct bonding of the surface molecules takes place, much like the newly exposed adhesive of a paper sticker or a band-aid should be directly applied to its target with no intervening compromise. The example method described herein, however, adds an extra step and further cleans the activated surface, even after activation. As above, this is beneficial because horizontal spacing between conductive leads, posts, pads, and interconnects at the direct bonding surface is becoming so small that metal nanoparticles which were ignorable before, can no longer be ignored due to their propensity to seed electrical leakage between conductive features that are spaced so finely.

Example Embodiments

Figure 1:
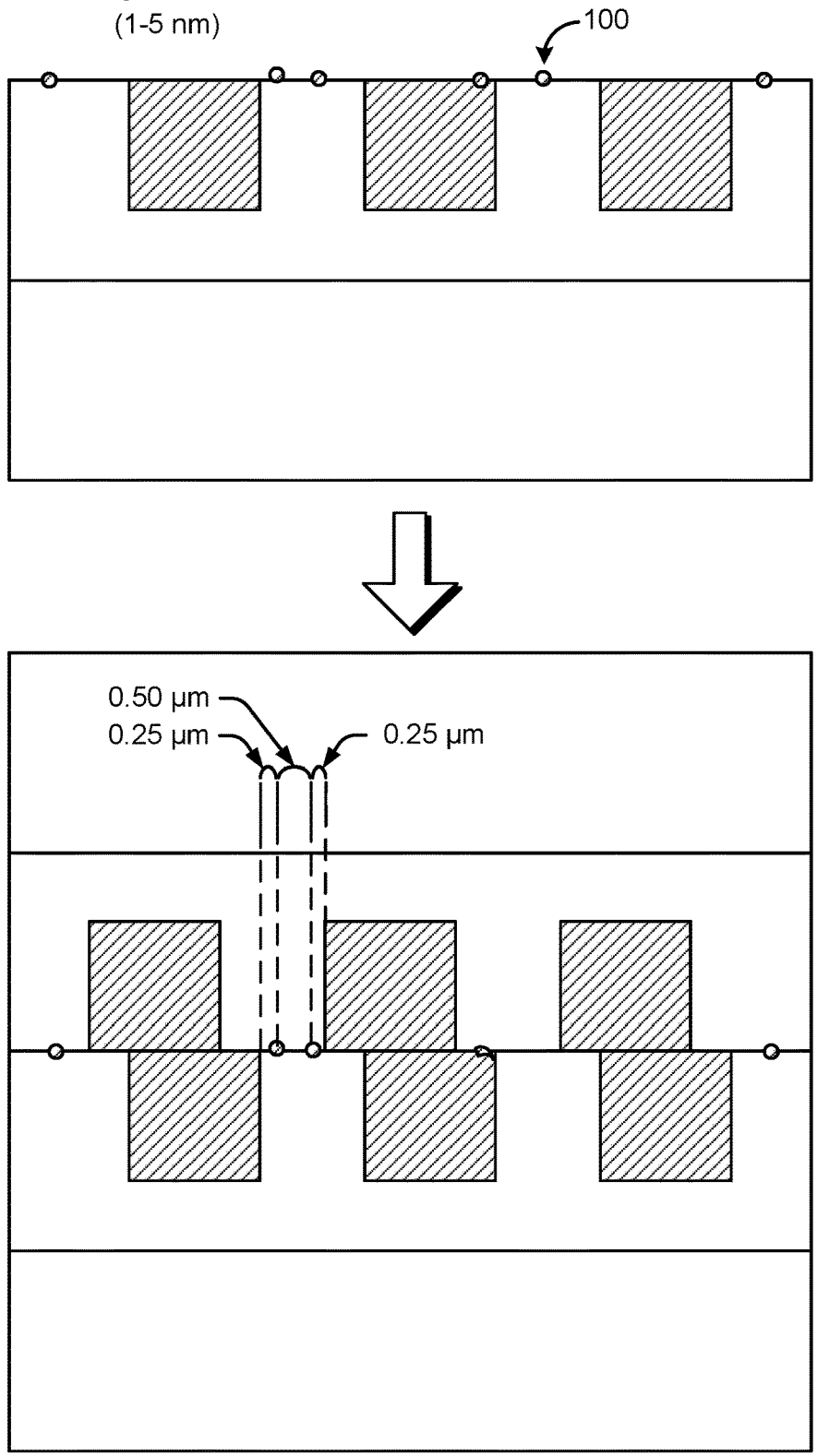
FIG. 1 is a diagram of a conventional device with a bonding interface created via hybrid bonding and with a population of extraneous metal nanoparticles dispersed across the dielectric and metal surface areas of the respective bonding surfaces and completed bonding interface.
Figure 2:
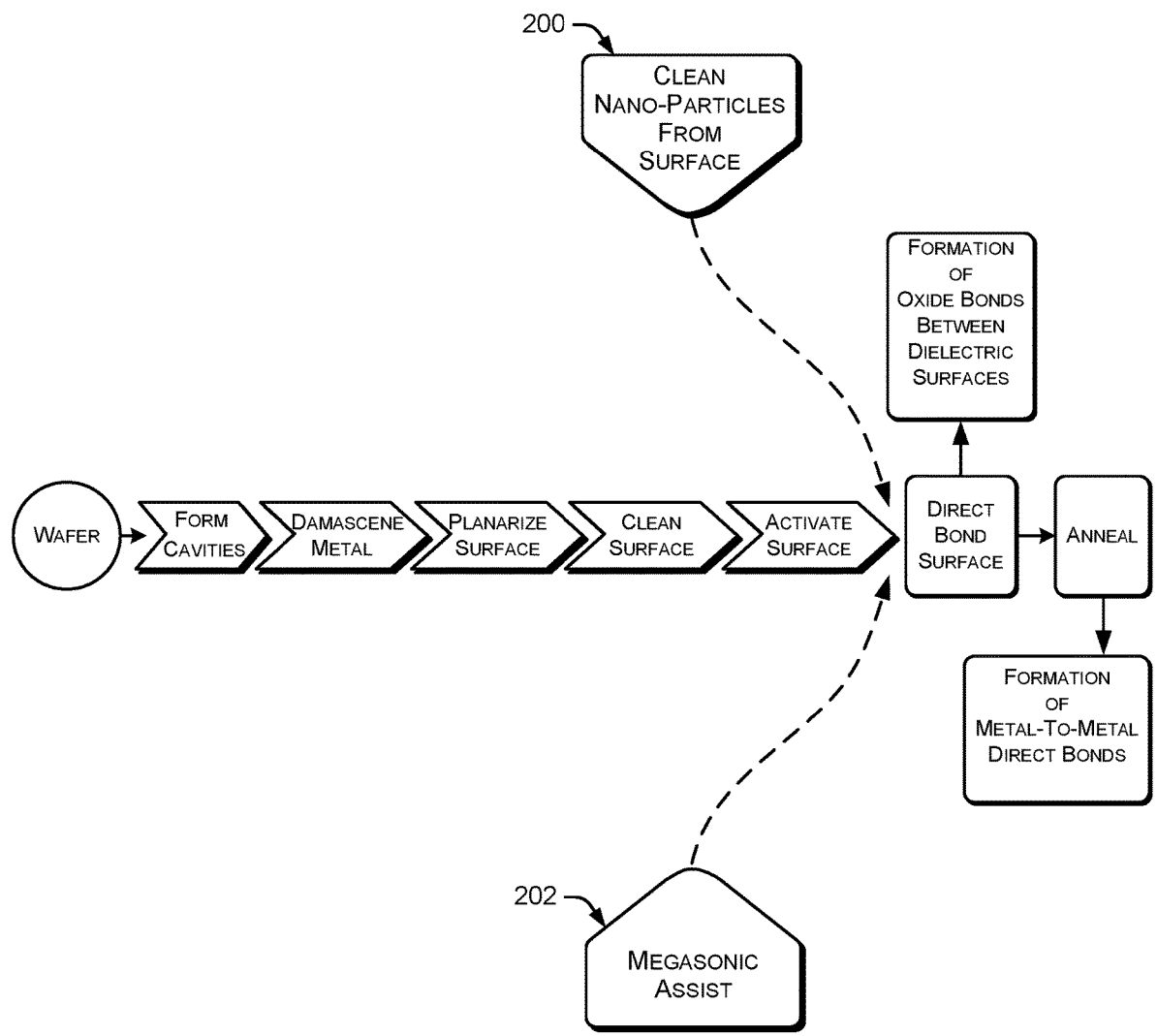
FIG. 2 is a diagram of an example method of cleaning nanoparticles from a bonding surface after surface activation, but before direct bonding takes place.

FIG. 2 shows an example process flow for conventional hybrid bonding, except that a novel cleaning operation 200 has been added between surface activation and the initial stage of the hybrid bonding operation itself. The surface activation is usually plasma activation. The cleaning of nanoparticles from the prepared and activated bonding surface can employ both physical removal means, and also chemical means that dissolve the metal nanoparticles. In one embodiment, the post activation cleaning process may include spraying known cleaning chemicals on the activated surface to remove the nanoparticles. The nanoparticle-clean surface may be further rinsed with DIW before the bonding operation. In another embodiment, the cleaning operation can optionally be assisted with megasonic agitation 202 of the cleaning reagents used. The cleaning fluid may be a very dilute organic or inorganic acid or may be one or more organic alkaline compounds. The organic acid may include carboxylic moieties, for example acetic, butyric, sulfonic, sulfamic, ascorbic, acetylsalicylic, oxalic, tartaric, formic, and mallic acids among others. The inorganic acid compounds may exclude acids containing chloride, nitric, or nitrous ion moieties from being in the cleaning fluids, for example hydrochloric acid, nitric acid, and their likes may be excluded. However, the inorganic acid compounds may include very dilute sulfuric acid, phosphoric acid, buffered hydrofluoric acid (BHF), and their likes, for example.

The cleaning process may apply very gentle metal etching reagents that meet stringent requirements for etching metals at nanometer scale sizes and rates, without forming excessive recesses in the conductive layers of interest, or roughening the dielectric bonding surface. In an implementation, the concentration of the acid or key active agent in the cleaning fluid is less than 1% of the formulary by volume, for example, and preferably less than 0.05% by volume. The cleaning times may range from 2 seconds to preferably less than 180 seconds. The particle removal rate of a given cleaning fluid may be reduced or modulated by the addition of a second or third chemical, for example one or more compounds containing a polyol. In one example, the polyol compound may be glycerin or a glyceride. The concentration of the polyol may range from 0.2% to 15% by volume and preferably less than 10% by volume. The higher the concentration of the polyol content, the lower the etch rate of the cleaning fluid. Also, polyols such as glycerin can serve as a wetting agent in the formulation to improve the uniformity of etching globally across the substrate.

In one embodiment, the cleaning fluid may include a combination of an inorganic acid and an organic acid. In some applications, the cleaning fluid may contain a very small amount of an inorganic or organic peroxide or one or more other inorganic compounds. In some applications, the cleaning fluid may include a quaternary ammonium compound, for example tetramethyl ammonium hydroxide. The concentration of the quaternary ammonium compound may range between 0.1 to 5% by volume and preferably less than 2.5% by volume.

Still in another embodiment the unwanted nanoparticles may be mechanically removed by application of carbon dioxide particles (dry ice) in a spray cleaning.

Various forms of hybrid bonding provide wafer-to-wafer (W2W) bonding, die-to-wafer (D2W) bonding, and panel-to-panel bonding in various circumstances. For example, cavities and trenches are formed in the wafer surfaces by known methods, and then metal is formed to overfill the cavities and trenches of interest by a damascene process, for example. The formed metal may include an adhesion or barrier layer disposed between the dielectric layer and the metal. The barrier layer may be conductive or nonconductive. The metal and surface layers are planarized, with conductive features, for example metal bond pads and metal features ending up very flat or very slightly recessed from the dielectric surface layer because of very slight dishing from the polishing of a CMP process. The recess may be typically less than 35 nm at greatest depth from the polished top surface and preferably less than 25 nm. The bonding surface is then rinsed with DIW or with other cleaning solutions. In some applications the cleaned surface may be further exposed to oxygen plasma (ashing step) to remove organic residues from the planarized surface. The ashing step may end up sputtering the spurious nanoparticles from the metal pad region to portions of the dielectric surface. Routinely, the ashing surface is cleaned with the deionized water (DIW). The surface is then activated by exposure or bombardment with nitrogen plasma or other ionized species (activation step). The plasma activation step may be another source of the spurious nanoparticles. The activated surface may be cleaned with DIW again before the bonding operation. Conventionally, the cleaned surfaces of interest are then aligned and instantly direct bonded to each other at room temperature through mere contact of the surfaces. But the example cleaning procedures described herein intervene between the surface activation step and the direct bonding or hybrid bonding steps.

Once direct bonding contact has been made between dielectric surfaces to initiate dielectric-to-dielectric bonding, mechanical mating and bonding of the recessed metal interconnects on each side of the bonding interface between the surfaces takes place during a subsequent higher temperature annealing. The substrate stacking operation may comprise for example, bonding two or more wafers to form a bonded wafer stack (W2W or multiple W2Ws), or bonding one or more smaller substrates to a larger substrate as in a die to wafer (D2W) operation, or bonding one die to another die or to a stack of dies (D2D). For a die to die bonding operation, the first die may be larger than the second die. Hybrid bonding allows wafers to be bonded with exceptionally fine pitched 3D electrical interconnects. In some embodiments, the annealing process comprises a batch anneal on multiple W2W or D2W stacks.

The polishing and dishing steps are achieved using standard chemical mechanical polishing (CMP) tools with known CMP polishing slurries and known post-polishing CMP slurry cleaning methods. The surface activation step may be accomplished with nitrogen-based chemistries and are then applied through conventional plasma etch tools. After the cleaning procedures described herein, the prepared, activated, and cleaned wafers can then simply be aligned and placed together resulting in the spontaneous formation of chemical bonds between the prepared dielectric surfaces. During the annealing process, the metal bond pads expand mating into one another to form a homogeneous metallic interconnect. In some embodiments, one or more metal grains may grow across the bond interface from the pads of the first substrate to the opposing pads of the second substrate. Concurrently, the chemical bond between oxides is also significantly strengthened by the annealing process, ensuring high reliability without requiring underfill.

Figure 3:
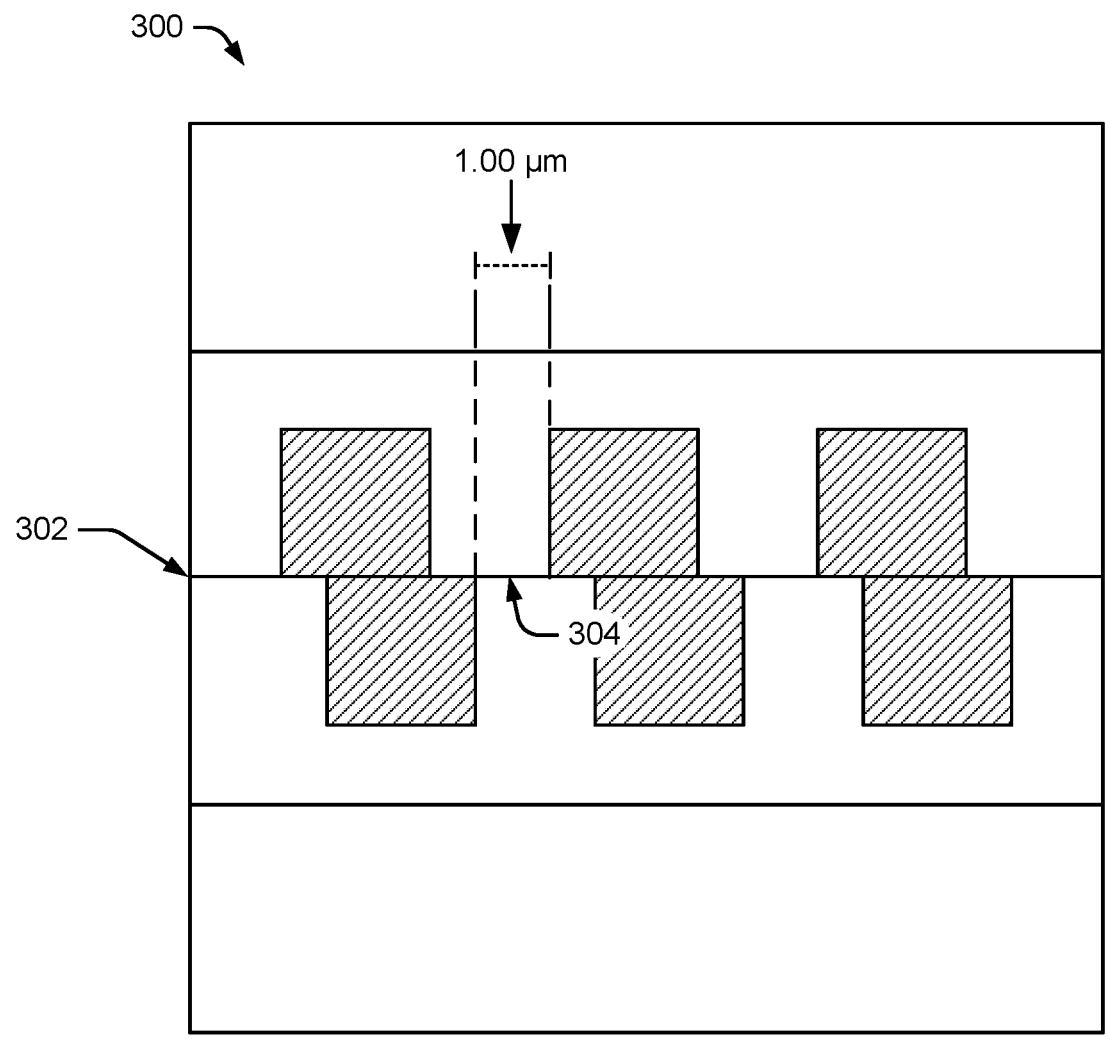
FIG. 3 is a diagram of an example device with a bonding interface created via hybrid bonding in the absence of extraneous metal nanoparticles that have been physically removed or dissolved from the bonding surfaces after surface activation but before the hybrid bonding.

FIG. 3 shows an example apparatus 300 including a bonding interface 302 that has been hybrid bonded in the absence of the metal nanoparticles 100. An example cleaning process 200 has been applied that removes the extraneous metal nanoparticles 100 after the plasma processing step, for example, after substrate surface ashing or surface activation or both, before hybrid bonding takes place. With few or no metal nanoparticles 100 trapped in the bonding interface 302, horizontal expanses 304 of directly bonded dielectric remain uncompromised, such as the full 1 µm expanse 304 shown. The freedom from metal nanoparticle contamination ensures the integrity of the electrical performance of the device.

Figure 4:
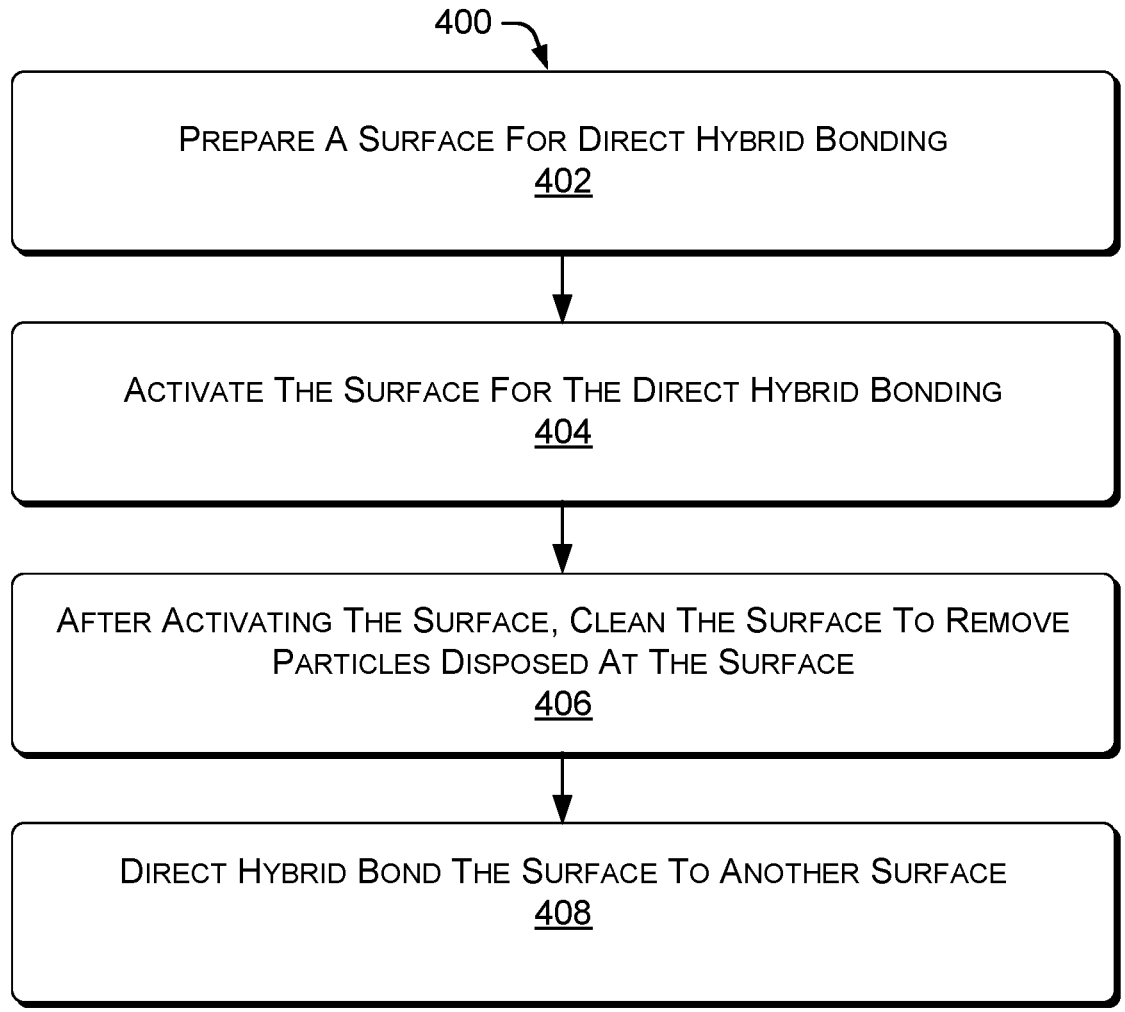
FIG. 4 is a flow diagram of an example method of increasing the reliability of a hybrid bonded device.

FIG. 4 shows an example method 400 of increasing the reliability of a hybrid bonded device. Operations of the example method 400 are shown in individual blocks in the flow diagram.

At block 402, a surface for hybrid bonding is prepared.

At block 404, the surface for hybrid bonding is activated. For example, the surface may be activated with plasma, such as nitrogen plasma or oxygen plasma or combinations thereof. The surface activation increases the overall bond energy of the completed hybrid bonds.

At block 406, after activating the bonding surface, the surface is cleaned to remove particles disposed at the surface.

At block 408, the surface is hybrid bonded to another surface.

Figure 5:
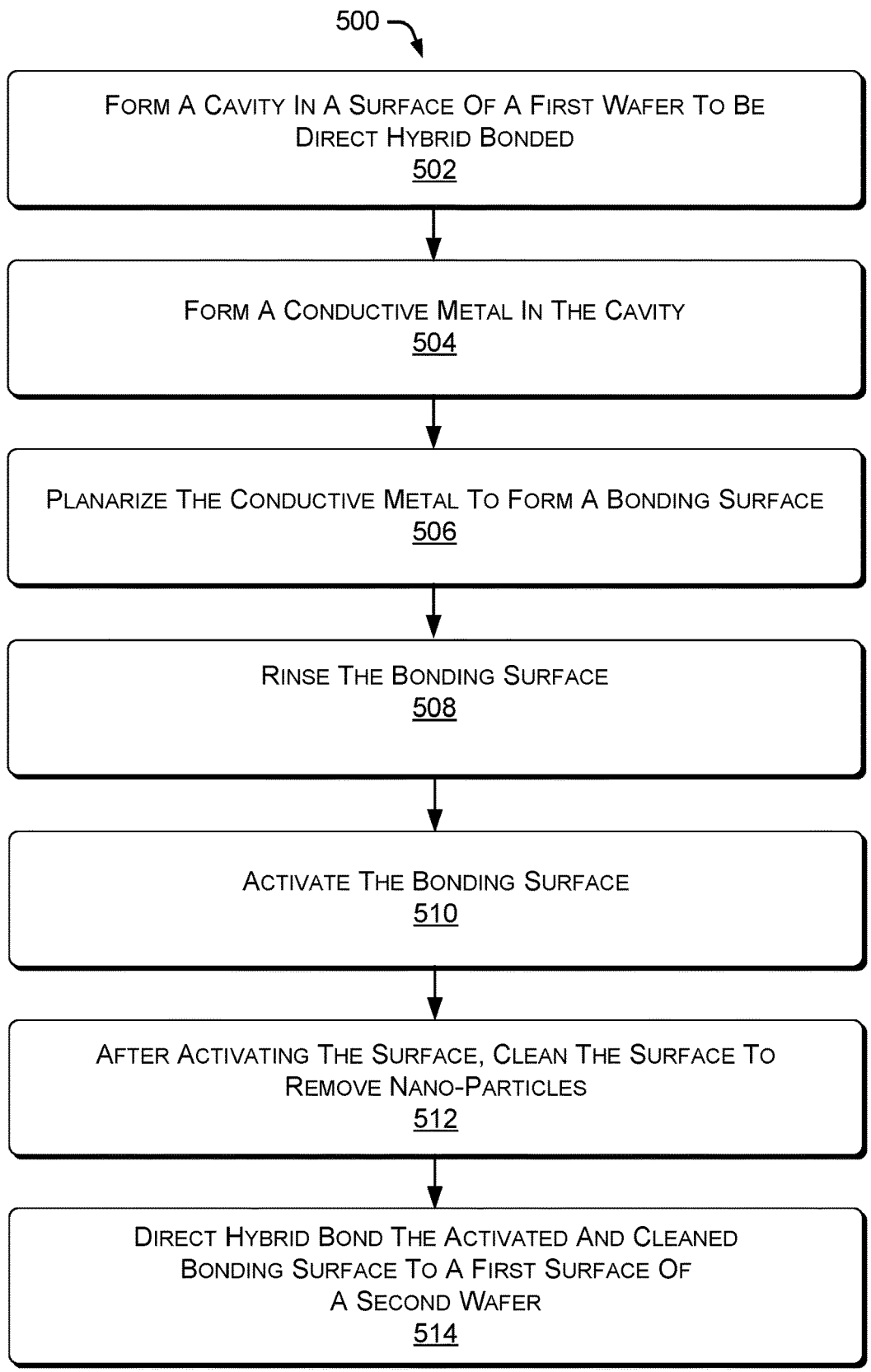
FIG. 5 is a flow diagram of another example method of increasing the reliability of a hybrid bonded device.

FIG. 5 shows another example method 500 of increasing the reliability of a hybrid bonded device. Operations of the example method 500 are shown in individual blocks in the flow diagram.

At block 502, a cavity is formed in a surface of a first wafer to be hybrid bonded.

At block 504, a metal is formed in the cavity. The metal may be deposited by a damascene process, including seeding the cavity or trench, and depositing the metal, such as copper, by deposition, electroplating, and so forth. The metal plated substrate can be further annealed by thermal treatment before the planarization step.

At block 506, at least the metal is planarized with a suitable flattening technique, such as chemical mechanical planarization (CMP).

At block 508, the bonding surface is cleaned after the CMP step to remove any residual polishing slurry material on the bonding surface. At block 510, the prepared bonding surface is surface activated with plasma or other activation means. An ashing step may precede this activation step or vice versa. In some applications, the ashing step may comprise the surface activation step.

At block 512, after activating the surface, the surface is cleaned of nanoparticles, so that there are no remaining particles or fewer than 2 particles per square micron of the mutual surface area of both surfaces to be hybrid bonded together. Cleaning as used herein means one or both or any combination of physically removing the metal nanoparticles or dissolving the metal nanoparticles with a reagent or cleaning solution, such as an acid or base (alkali) solution. The cleaning step may comprise applying DIW to rinse off the cleaning fluid from the bonding surface prior to drying the cleaned substrate.

At block 514, after the cleaning of metal nanoparticles, the activated and cleaned bonding surface is hybrid bonded to a first surface of a second wafer or to the receiving surface of interest. The receiving surface of interest may include a dielectric surface or the surface of another die.

The method 500 may be repeated on the second surface of the second wafer (or die) and repeated thence to create a stack of wafers (or dies, or both) making a 3D or a 2.5D stacked microelectronic package or device of hybrid bonded wafers (or dies) that have had their respective metal nanoparticles between each layer removed, preserving the integrity of the electrical operation of the entire stacked micropackage.

Reiterating the example processes and apparatuses described, an example method includes preparing a surface for hybrid bonding, the hybrid bonding comprising direct bonding between opposing dielectric materials and direct metal-to-metal bonding between opposing conductive materials, activating the surface for the hybrid bonding, then after activating the surface, cleaning the surface to remove particles disposed at the surface, and then hybrid bonding the surface to another surface.

Preparing the surface for hybrid bonding can include forming cavities in the surface, forming a conductive metal in the cavities, and planarizing the surface to provide a smooth oxide surface and conductive metal recesses.

The example method can further include ashing the smooth oxide surface and conductive metal recesses to remove organic traces of unwanted organic materials, and rinsing the surface with deionized water or other rinsing or cleaning reagent.

Activating the surface for the hybrid bonding usually includes plasma activating the surface.

The operation of cleaning the surface to remove particles can include physically removing the particles or dissolving the particles.

In an implementation, cleaning the surface to remove particles disposed at the surface applies an alkaline developer solution to remove or dissolve the particles. A concentration or pH of the alkaline developer can be selected to remove 1-10 nm copper or metal particles in a selected amount of time without affecting the activated surface and/or without significantly damaging or degrading the activated bonding surface. The cleaning operation can also optionally include applying a megasonic agitation to the cleaning solution to assist removing the particles disposed at the surface.

In various implementations, cleaning the surface to remove particles disposed at the surface can further include applying a reagent containing at least one agent selected from hydrogen peroxide, tetra methyl ammonium hydroxide, and sulfuric acid, for example. A concentration or a pH of the agent is selected to dissolve 1-10 nm copper or metal particles in a selected amount of time without degrading the activated surface or the prepared bonding surface. With the select cleaning solution or reagent, a megasonic agitation may be applied to the solution or reagent to assist removing the particles disposed at the surface.

An example apparatus has a directly bonded bonding interface, and less than two extraneous metal nanoparticles on average per square micron of the bonding interface area. Ideally, the directly bonded bonding interface has no extraneous metal nanoparticles.

An example hybrid bonding method for wafer-to-wafer or die-to-wafer micropackaging includes forming a cavity in a surface of a first wafer to be hybrid bonded, forming a conductive metal in the cavity, planarizing the conductive metal to form a smooth bonding surface, rinsing the bonding surface, activating the bonding surface, after activating the bonding surface, cleaning the bonding surface to remove nanoparticles, and hybrid bonding the activated and cleaned bonding surface to a first surface of a second wafer.

This example method further includes annealing the hybrid bonded bonding surface at an elevated temperature that may range between 150 to 350° C., and preferably less than 305° C. The example method further includes preparing a second surface of the second wafer or substrate for hybrid bonding, activating the second surface of the second substrate, then after activating the second surface of the second substrate, cleaning the second surface of the second substrate to remove nanoparticles, and hybrid bonding the activated and cleaned second surface of the second substrate to a next surface of a next substrate of interest. In some applications, the cleaned prepared bonding surface of the second substrate, without further plasma processing, may be directly bonded to the other surface of interest.

The example method further includes repeating the method for X number of bonding surfaces of Y number of wafers or dies, to make a hybrid bonded stack of wafers or dies Y layers thick. In an implementation, the example method further includes performing at least part of the hybrid bonding method in a flip chip bonder. Ashing the bonding surface with oxygen plasma or another ashing agent may also included in the method after the planarization step. The operation of rinsing the bonding surface after planarizing can be done with deionized water. Also, the substrate cleaning steps and the plasma processing steps may be performed in a batch mode in various appropriate batch reactors. As above, cleaning the bonding surface after activation to remove metal nanoparticles can use a reagent containing at least one agent selected from an alkaline developer, hydrogen peroxide, tetra methyl ammonium hydroxide, and inorganic and organic acid, among others. A concentration or a pH of the agent is selected to dissolve or remove 1-10 nm copper particles in a selected amount of time without degrading the activated surface or the prepared bonding surface.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific dimensions, quantities, material types, fabrication steps and the like can be different from those described above in alternative embodiments. The term "coupled" is used herein to express a direct connection as well as a connection through one or more intervening circuits or structures. The terms "example," "embodiment," and "implementation" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

While the present disclosure has been disclosed with respect to a limited number of embodiments, those skilled in the art, having the benefit of this disclosure, will appreciate numerous modifications and variations possible given the description. It is intended that the appended claims cover such modifications and variations as fall within the true spirit and scope of the disclosure.

The invention claimed is:

1. A method, comprising:
   preparing a surface for hybrid bonding, the hybrid bonding comprising direct bonding between dielectric materials and direct metal-to-metal bonding between conductive materials;
   plasma activating the surface for the hybrid bonding;
   after plasma activating the surface, cleaning the surface to remove metal particles disposed at the surface; and
   hybrid bonding the surface to another surface.

2. The method of claim 1, wherein preparing the surface for hybrid bonding comprises:
   forming cavities in the surface;
   forming a conductive metal in the cavities; and
   planarizing the surface to provide a smooth oxide surface and conductive metal recesses.

3. The method of claim 2, further comprising:
   ashing the smooth oxide surface and conductive metal recesses to remove organic traces of a resist material; and
   rinsing the surface with a cleaning fluid to remove contaminating particles from the bonding surface.

4. The method of claim 1, wherein cleaning the surface to remove metal particles comprises physically removing the metal particles.

5. The method of claim 1, wherein cleaning the surface to remove metal particles comprises dissolving the metal particles.

6. The method of claim 1, wherein cleaning the surface to remove metal particles disposed at the surface further comprises applying an alkaline solution to remove the metal particles.

7. The method of claim 6, wherein a concentration or a pH of the alkaline solution is selected to dissolve 1-10 nanometer copper or metal particles in a selected amount of time without degrading the plasma activated surface.

8. The method of claim 6, further comprising applying a megasonic agitation to the alkaline solution or acidic solution to assist removing the metal particles disposed at the surface.

9. The method of claim 1, wherein cleaning the surface to remove metal particles disposed at the surface comprises applying a cleaning solution containing at least one agent selected from the group consisting of hydrogen peroxide, tetra methyl ammonium hydroxide, an organic acid, and an inorganic acid.

10. The method of claim 9, wherein the concentration of the at least one agent is selected to be less than 1% of the cleaning solution by volume.

11. The method of claim 9, further comprising applying a megasonic agitation to the cleaning solution to assist removing the metal particles disposed at the surface.

12. An apparatus, comprising:
a directly bonded bonding interface; and
less than two extraneous metal nanoparticles on average per square micron of the bonding interface area.

13. A hybrid bonding method for wafer-to-wafer or die-to-wafer or die-to-die or two substrates packaging, comprising:
forming a cavity in a surface of a first substrate to be hybrid bonded;
forming a conductive metal in the cavity;
planarizing the conductive metal to form a bonding surface;
rinsing the bonding surface;
plasma activating the bonding surface;
after plasma activating the bonding surface, cleaning the bonding surface to remove metal nanoparticles; and
hybrid bonding the activated and cleaned bonding surface to a first surface of a second substrate.

14. The hybrid bonding method of claim 13, further comprising annealing the hybrid bonded bonding surface at an elevated temperature.

15. The hybrid bonding method of claim 13, further comprising preparing a second surface of the second substrate for hybrid bonding;
activating the second surface of the second substrate;
after activating the second surface of the second wafer, cleaning the second surface of the second substrate to remove nanoparticles; and
hybrid bonding the activated and cleaned second surface of the second substrate to a next surface of a next substrate.

16. The hybrid bonding method of claim 15, further comprising repeating the method for X bonding surfaces of Y substrates or dies, to make a hybrid bonded stack of substrates or dies Y layers thick.

17. The hybrid bonding method of claim 16, further comprising performing at least part of the hybrid bonding method in a flip chip bonder.

18. The hybrid bonding method of claim 13, further comprising ashing the bonding surface after planarizing the bonding surface.

19. The hybrid bonding method of claim 13, wherein rinsing the bonding surface after planarizing the bonding surfaces comprises rinsing with deionized water.

20. The hybrid bonding method of claim 13, wherein cleaning the bonding surface to remove metal nanoparticles further comprises applying a cleaning solution containing at least one agent selected from the group consisting of an alkaline developer, hydrogen peroxide, tetra methyl ammonium hydroxide, an organic acid, and an inorganic acid.

21. The hybrid bonding method of claim 20, wherein a concentration or a pH of the agent is selected to dissolve 1-10 nanometer copper or metal particles in a selected amount of time without degrading the activated surface.

* * * * *